United States Patent
Kao et al.

(10) Patent No.: US 7,688,146 B2
(45) Date of Patent: Mar. 30, 2010

(54) SINGLE-ENDED INPUT TO DIFFERENTIAL-ENDED OUTPUT LOW NOISE AMPLIFIER

(75) Inventors: Nien-An Kao, Taipei County (TW); Kwo-Wei Chang, Hsinchu County (TW)

(73) Assignee: Princeton Technology Corporation, Taipei (TW)

( * ) Notice: Subject to any disclaimer, the term of this patent is extended or adjusted under 35 U.S.C. 154(b) by 218 days.

(21) Appl. No.: 11/657,518

(22) Filed: Jan. 25, 2007

(65) Prior Publication Data
US 2007/0205829 A1 Sep. 6, 2007

(30) Foreign Application Priority Data
Mar. 1, 2006 (TW) ................. 95106774 A

(51) Int. Cl.
*H03F 3/04* (2006.01)
(52) U.S. Cl. .................. 330/301; 330/277
(58) Field of Classification Search .......... 330/301, 330/277, 283, 311
See application file for complete search history.

(56) References Cited

U.S. PATENT DOCUMENTS

| | | | | |
|---|---|---|---|---|
| 4,885,550 A * | 12/1989 | Ferrer | .......... | 330/301 |
| 5,142,241 A * | 8/1992 | Yamamoto et al. | .......... | 330/253 |
| 5,361,050 A * | 11/1994 | Einbinder | .......... | 333/204 |
| 5,694,083 A | 12/1997 | Umeyama et al. | | |
| 5,945,878 A * | 8/1999 | Westwick et al. | .......... | 330/301 |
| 6,121,809 A * | 9/2000 | Ma et al. | .......... | 327/246 |
| 6,252,460 B1 * | 6/2001 | Ito | .......... | 330/301 |
| 6,559,723 B2 * | 5/2003 | Hollenbeck et al. | .......... | 330/301 |
| 6,566,961 B2 * | 5/2003 | Dasgupta et al. | .......... | 330/301 |
| 6,819,179 B2 * | 11/2004 | Raja et al. | .......... | 330/285 |
| 7,193,475 B2 * | 3/2007 | Su et al. | .......... | 330/301 |
| 7,205,844 B2 * | 4/2007 | Su et al. | .......... | 330/301 |
| 7,345,547 B2 * | 3/2008 | Wang et al. | .......... | 330/285 |
| 7,368,993 B2 * | 5/2008 | Beffa | .......... | 330/277 |
| 7,375,590 B2 * | 5/2008 | Su et al. | .......... | 330/301 |
| 2003/0228858 A1 | 12/2003 | Zhang et al. | | |
| 2005/0107055 A1 | 5/2005 | Bult et al. | | |
| 2005/0225397 A1 | 10/2005 | Bhatia et al. | | |
| 2008/0111632 A1 * | 5/2008 | Gong et al. | .......... | 330/310 |
| 2008/0122538 A1 * | 5/2008 | Park et al. | .......... | 330/253 |
| 2008/0242257 A9 * | 10/2008 | Aparin | .......... | 455/341 |

FOREIGN PATENT DOCUMENTS

| | | |
|---|---|---|
| JP | 9139689 | 5/1997 |
| JP | 2001-077641 | 3/2001 |

* cited by examiner

*Primary Examiner*—Khanh V Nguyen
(74) *Attorney, Agent, or Firm*—Muncy, Geissler, Olds & Lowe, PLLC

(57) ABSTRACT

A single-ended input to differential-ended output amplifier circuit comprises an amplifier for amplifying an input signal into an amplified signal comprises an input for receiving the input signal; and a first input and a single-ended input to differential-ended output conversion circuit to convert the amplified signal to a differential signal pair, comprising a first transistor for receiving the amplified signal having a first gate coupled to the first output, a first first terminal coupled to a second output, and a first second terminal coupled to a first node; a second transistor having a second gate, a second first terminal coupled to a third input, and a second second terminal coupled to the first node; a second capacitor coupled between the second output and the second gate; a first and a second resistors and the voltage source; and a current source coupled between the first node and a ground.

27 Claims, 4 Drawing Sheets

SINGLE-ENDED INPUT TO DIFFERENTIAL-ENDED OUTPUT LOW NOISE AMPLIFIER

BACKGROUND OF THE INVENTION

1. Field of the Invention

The invention relates to signal processing circuit, and more particularly to a single-ended input to differential-ended output low noise amplifier circuit.

2. Description of the Related Art

A single-ended antenna is a widely used type of antenna. An image-rejection mixer for signal down-conversion is however implemented by a differential-ended input double-balanced mixer. The single-ended input signal received by the single-ended antenna has to be converted into differential-ended output signal. Therefore, the signal received by the antenna can be post-processed after down-conversion through the image-rejection mixer.

There are two conventional methods for converting the single-ended input signal into the differential-ended output signal. One is a single-ended input to differential-ended output amplifier circuit 100 presented in FIG. 1, comprising a balun 12 and a differential-ended input to differential-ended output amplifier 13. Differential-ended input to differential-ended output amplifier 13 can be a low noise amplifier (LNA). The method is implemented by adding balun 12 outside the chip. Balun 12 has two inputs, one is coupled to an antenna 11, and the other is coupled to the ground. Two outputs of balun 12 are respectively coupled to two outputs of differential-ended input to differential-ended output amplifier 13. Balun 12 is composed of capacitors and inductors. One input of balun 12 receives the single-ended input signal from antenna 11 and the single-ended input signal is converted into the differential-ended output signal. The single-ended input signal can be a radio frequency (RF) signal. Then, the differential-ended output signal transferred to differential-ended input to differential-ended output amplifier 13. Differential-ended input to differential-ended output amplifier 13 amplifies the differential-ended output signal and generates a differential-ended output amplified signal. Accordingly, the differential-ended output amplified signal of the single-ended input to differential-ended output amplifier circuit 100 can be transferred to the two inputs of an image-rejection mixer 14 for down-conversion.

Typically, differential-ended input to differential-ended output amplifier 13 and image-rejection mixer 14 are designated inside the chip. Since the signal received by antenna 11 has to be post-processed through image-rejection mixer 14 after down-conversion, the method of single-ended input to differential-ended output amplifier circuit 100 shown in FIG. 1 is adopted. In FIG. 1, balun 12 is added outside the chip. Thus, image-rejection mixer 14 can receive the differential-ended output amplified signal and which can then be post-processed. Because the method requires additional components, the cost of the chip module may be increased.

FIG. 2 is another single-ended input to differential-ended output amplifier circuit 200, comprising a single-ended input to single-ended output amplifier 22 and a single-ended input to differential-ended output inductive transformer 23. Single-ended input to single-ended output amplifier 22 can be a low noise amplifier. The method is implemented by adding a single-ended input to differential-ended output inductive transformer 23 to the chip comprising single-ended input to single-ended output amplifier 22 and an image-rejection mixer 24. An antenna 21 is coupled to single-ended input to single-ended output amplifier 22. The output end of single-ended input to single-ended output amplifier 22 is coupled to the input of single-ended input to differential-ended output inductive transformer 23. Antenna 21 receives single-ended input signal which is then transferred to single-ended input to single-ended output amplifier 22. The single-ended signal can be a radio frequency signal. Single-ended input to single-ended output amplifier 22 amplifies the single-ended signal into an amplified signal, which is then transferred to single-ended input to differential-ended output inductive transformer 23. Single-ended input to differential-ended output inductive transformer 23 amplifies the amplified signal into differential-ended output signal. Thus, the differential-ended output signal of single-ended input to differential-ended output amplifier circuit 200 can be transferred to two inputs of image-rejection mixer 24.

However, single-ended input to differential-ended output amplifier circuit 200 shown in FIG. 2 is implemented by adding single-ended input to differential-ended output inductive transformer 23 to the chip. Single-ended input to differential-ended output inductive transformer 23 composed of capacitors and inductors need a large die area, although the cost for additional components is reduced.

Presently, a differential amplifier pair with grounded negative terminal can be used to replace single-ended input to differential-ended output inductive transformer 23 shown in FIG. 2. FIG. 3A is a conventional single-ended input to differential-ended output amplifier circuit 300. An antenna 31 is coupled to a single-ended input to single-ended output amplifier 32. Single-ended input to single-ended output amplifier 32 can be a low noise amplifier. An output amplified signal of single-ended input to single-ended output amplifier 32 is coupled to an input of a differential amplifier pair circuit with grounded negative terminal 33.

FIG. 3B is differential amplifier pair circuit with grounded negative terminal 33 comprising a first transistor 301, a second transistor 302, a first resistor 303, a second resistor 304, a current source 305, a capacitor 306, a first output 307, a second output 307', a voltage source VDD, a ground VSS and a first node 3A. The gate of first transistor 301 is coupled to the output of single-ended input to single-ended output amplifier 32. The drain of first transistor 301 is coupled to first output 307. The source of first transistor 301 is coupled to first node 3A. The gate of second transistor 302 is coupled to capacitor 306. The drain of second transistor 302 is coupled to second output 307'. The source of second transistor 302 is coupled to first node 3A. First resistor 303 is coupled between first output 307 and voltage source VDD. Second resistor 304 is coupled between second output 307' and voltage source VDD. Current source 305 is coupled between first node 3A and ground VSS. Capacitor 306 is coupled between second transistor 302 and ground VSS. Therefore, the differential-ended output signal of single-ended input to differential-ended output amplifier circuit 300 can be transferred to two inputs of a image-rejection mixer 34 through first output 307 and second output 307' for down-conversion.

However, conventional differential amplifier pair circuit with grounded negative terminal 33 is used to replace single-ended input to differential-ended output inductive transformer 23 to reduce die size. The quality of the differential-ended output signal at the output of single-ended input to differential-ended output amplifier circuit 300 may be influenced by noise generated by the chip, which may be coupled to the input of differential amplifier pair circuit with grounded negative terminal 33 through the bypass capacitor 306 thereof.

BRIEF SUMMARY OF INVENTION

A detailed description is given in the following embodiments with reference to the accompanying drawings.

An embodiment of a single-ended input to differential-ended output amplifier circuit, comprising an amplifier and a single-ended input to differential-ended output conversion circuit. An amplifier for amplifying an input signal into an amplified signal, comprising an input end for receiving the input signal; and a first output. A single-ended input to differential-ended output conversion circuit to convert the amplified signal to a differential signal pair, comprising a first transistor for receiving the amplified signal having a first gate coupled to the first output end, a first first terminal coupled to a second output end, and a first second terminal coupled to a first node; a second transistor having a second gate, a second first terminal coupled to a third input end, and a second second terminal coupled to the first node; a second capacitor coupled between the second output end and the second gate; a first resistor coupled between the second output end and a voltage source; a second resistor coupled between the third output end and the voltage source; and a current source coupled between the first node and a ground.

Another embodiment of a signal processing circuit comprises an amplifier to amplify an amplified signal into an input signal, a single-ended input to differential-ended output conversion circuit, and an image-rejection mixer. An amplifier to amplify an amplified signal into an input signal comprises an input end for receiving the input signal; and a first output end. A single-ended input to differential-ended output conversion circuit for amplifying the amplified signal into a differential signal pair comprises a first transistor for receiving the amplified signal having a first gate coupled to the first input, a first first terminal coupled to a second output, and a first second terminal coupled to a first node; a second transistor having a second gate, a second first terminal coupled to a third output end, and a second second terminal coupled to the first node; a second capacitor coupled between the second output end and the second gate; a first resistor coupled between the second output and a voltage source; a second resistor coupled between the third output end and the voltage source; and a current source coupled between the first node and a ground. An image-rejection mixer comprises a first signal input terminal coupled to the second output end; and a second signal input terminal coupled to the third output end.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4A:
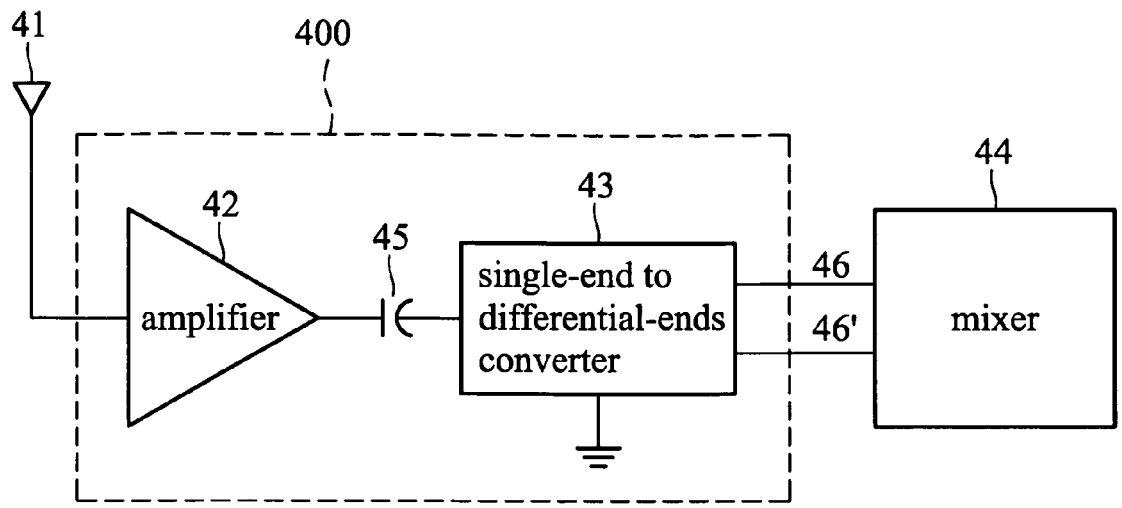
FIG. 4A is a single-ended input to differential-ended output amplifier circuit according to an embodiment of the invention.

FIG. 4A is a circuit of a single-ended input to differential-ended output amplifier 400 according to an embodiment of the invention, comprising a single-ended input to single-ended output amplifier 42 and a single-ended to differential-ended converter 43. An antenna 41 is coupled to the input end of single-ended input to single-ended output amplifier 42, and the output end thereof is coupled to the input end of single-ended to differential-ended converter 43. Single-ended input to differential-ended output amplifier 400 shown in FIG. 4A further comprises a first capacitor 45 coupled between single-ended input to single-ended output amplifier 42 and single-ended to differential-ended converter 43. First capacitor 45 is used to filters DC signals, and only AC signals can be transferred to single-ended to differential-ended converter 43.

Antenna 41 can be a single-ended antenna. Antenna 41 receives single-ended input signal. Single-ended input signal can be a radio frequency signal. Then, single-ended input to single-ended output amplifier 42 amplifies the single-ended input signal received by antenna 41 into an amplified signal. The amplified signal is transferred to single-ended to differential-ended converter 43 to generate differential-ended input signal.

Figure 5:
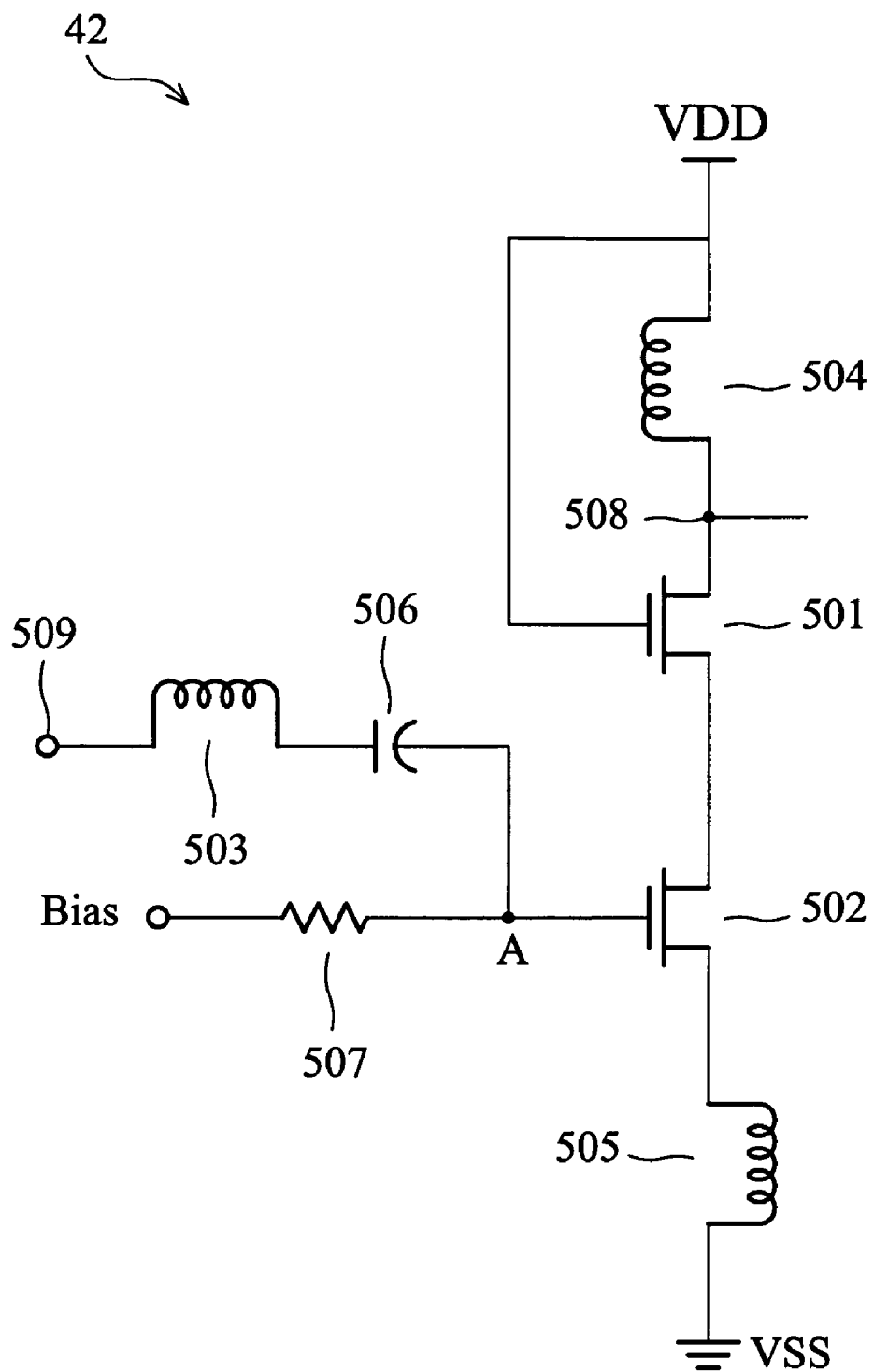
FIG. 5 is a circuit of single-ended input to single-ended output cascade low-noise amplifier according to an embodiment of the invention.

In one embodiment of the invention, the single-ended input to differential-ended output amplifier is a single-ended input to differential-ended output low noise amplifier. FIG. 5 is a circuit diagram of a single-ended input to signal-end output cascade low noise amplifier. In this embodiment, single-ended input to single-ended output amplifier 42 is an exemplary cascade low noise amplifier. Single-ended input to single-ended output cascade low noise amplifier is composed of a fourth transistor 501, a third transistor 502, a first inductor 503, a second inductor 504, a third inductor 505, a fifth capacitor 506, a third resistor 507, a bias source Bias, a voltage source VDD and a ground VSS. The gate of fourth transistor 501 is coupled to voltage source VDD. The drain of fourth transistor 501 is coupled to a first output end 508. The source of fourth transistor 501 is coupled to the drain of third transistor 502. The gate of third transistor 502 is coupled to a second node A. First inductor 503 is coupled between a first node 509 and fifth capacitor 506, wherein first node 509 is used to receive a single-ended input signal received by antenna 41. Fifth capacitor 506 is coupled between first inductor 503 and second node A. Third resistor 507 is coupled between second node A and bias source Bias. Second inductor 504 is coupled between voltage source VDD and first output end 508. Third inductor 505 is coupled between the source of third transistor 502 and ground VSS.

Figure 4B:
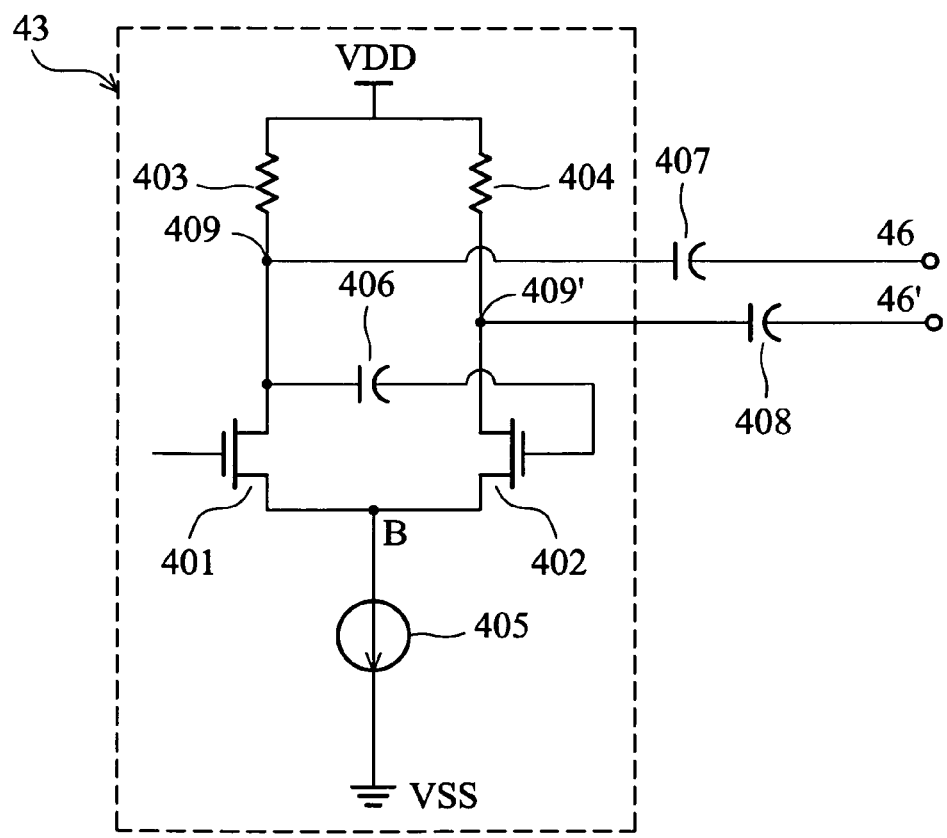
FIG. 4B is a single-ended to differential-ended conversion circuit according to an embodiment of the invention.

Referring to FIG. 4A and FIG. 4B, FIG. 4B is a circuit diagram of single-ended to differential-ended converter 43 according to an embodiment of the invention. Single-ended to differential-ended converter 43 is composed of a first transistor 401, a second transistor 402, a first resistor 403, a second resistor 404, a current source 405, a second capacitor 406, a voltage source VDD and ground VSS. The gate of first transistor 401 is coupled to first capacitor 45 as the input end of single-ended to differential-ended converter 43 for receiving an amplified signal output by single-ended input to single-ended output amplifier 42. The drain of first transistor 401 is coupled to a second output 409. The source of first transistor 401 is coupled to a first node B. The gate of second transistor 402 is coupled to second capacitor 406. The drain of second transistor 402 is coupled to a third output 409'. The source of second transistor 402 is coupled to first node B. Second capacitor 406 is coupled between second output 409 and the gate of second transistor 402 for coupling the voltage level of the drain of first transistor 401 to the gate of second transistor 402. First transistor 401 is turned-on when the amplified signal output by single-ended input to single-ended output amplifier 42 is high voltage level. Thus, the voltage level of the drain of first transistor 401 is decreased. Then, the voltage level will be coupled to the gate of second transistor 402 through second capacitor 406. Accordingly, the gate of first transistor 401 and second transistor 402 receive the input signal with phase difference of 180°. Thus, the differential-ended output signal at the output end of single-ended to differential-ended converter 43 having phase difference of 180°. On the other hand, first resistor 403 is coupled between voltage source VDD and second output 409, second resistor 404 is coupled between voltage source VDD and third output 409', and current source 405 is coupled between first node B and ground VSS.

In addition, single-ended input to differential-ended output amplifier 400 further comprises a third capacitor 407 and a fourth capacitor 408. Third capacitor 407 is coupled between second output end 409 and a first signal input terminal 46 of an image-rejection mixer 44. Fourth capacitor 408 is coupled between third output 409' and a second signal input terminal 46' of image-rejection mixer 44. Therefore, the differential-ended output signal of single-ended input to differential-ended output amplifier 400 can be transferred to first signal input terminal 46 and second signal input terminal 46' of image-rejection mixer 44 for down-conversion.

Single-ended to differential-ended converter 43 is used to convert the amplified signal amplified by single-ended input to single-ended output amplifier 42 into the differential-ended output signal with a phase difference of 180°. The bypass capacitor with grounded negative input is removed in the differential pair of single-ended to differential-ended converter 43, and second capacitor 406 is coupled from the gate of negative input terminal (second transistor 402) to the drain of the positive input terminal (first transistor 401). The noise of a substrate may not be coupled to the circuit, since second capacitor 406 is not directly connected to ground VSS. Thus, the noise of the circuit may be improved.

Figure 1:
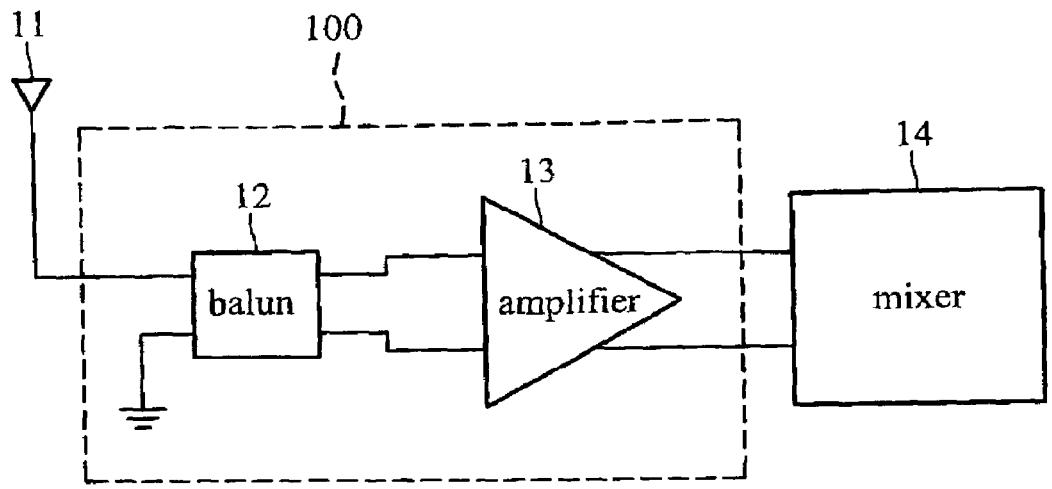
FIG. 1 is a conventional single-ended input to differential-ended output amplifier circuit.
Figure 2:
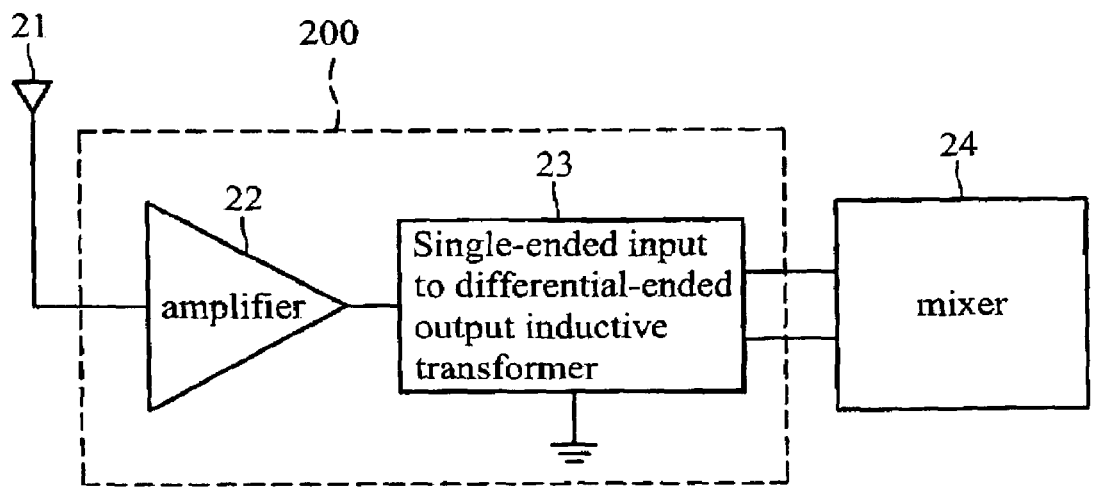
FIG. 2 is a conventional single-ended input to differential-ended output amplifier circuit.
Figure 3A:
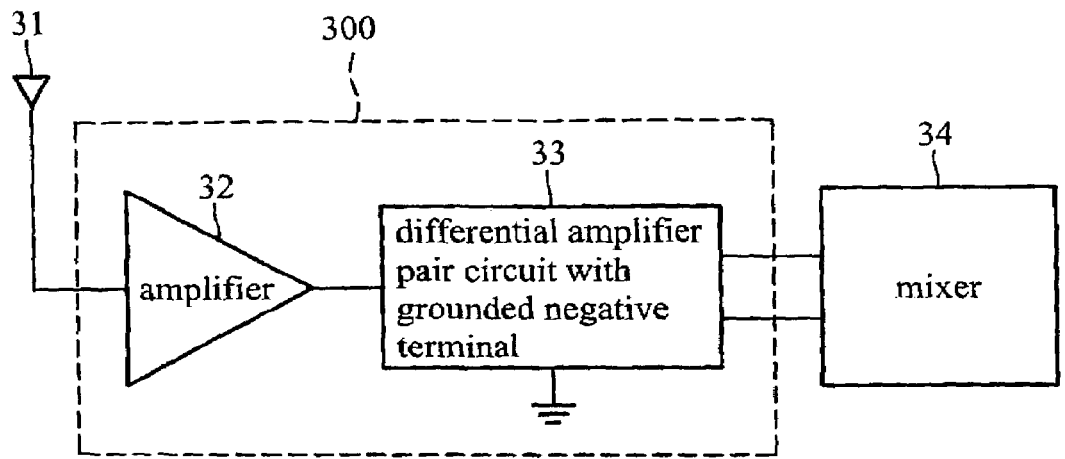
FIG. 3A is a conventional single-ended input to differential-ended output amplifier circuit.
Figure 3B:
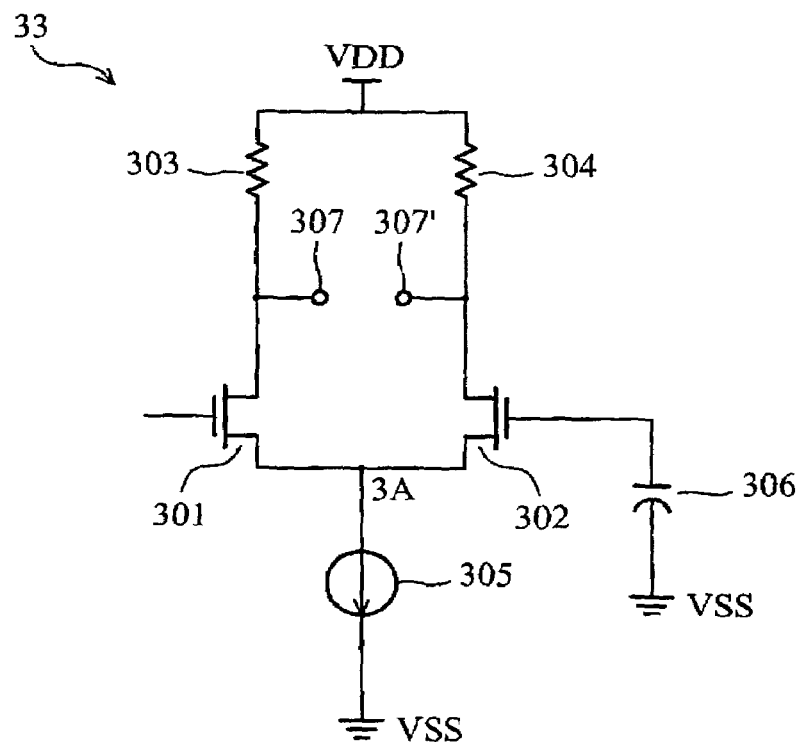
FIG. 3B is conventional differential amplifier pair circuit with grounded negative terminal.

Single-ended input to differential-ended output amplifier 400 is an integrated circuit of single-ended input to differential-ended output amplifier with small die size, low noise figure and high gain according to an embodiment of the invention. In addition, the die size of the chip can be reduced and additional components can be eliminated, since the conventional balun 12 shown in FIG. 2 and the conventional single-ended to differential-ended converter 23 composed of inductors and capacitors shown in FIG. 2 can be replaced by single-ended to differential-ended converter 43 in single-ended input to differential-ended amplifier 400. Therefore, not only can the die size of the chip be reduced, but additional components can also be eliminated. Accordingly, the small die size and low cost circuit may be achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A single-ended input to differential-ended output amplifier circuit, comprising:
   an amplifier for amplifying an input signal into an amplified signal, comprising:
      an input end for receiving the input signal; and
      a first output end; and
   a single-ended input to differential-ended output conversion circuit to convert the amplified signal to a differential signal pair, comprising:
      a first transistor for receiving the amplified signal having a gate coupled to the first output end, a first terminal coupled to a second output end, and a second terminal coupled to a first node;
      a second transistor having a gate, a first terminal coupled to a third output end, and a second terminal coupled to the first node;
      a first capacitor coupled between the second output end and the gate of the second transistor;
      a first resistor coupled between the second output end and a voltage source;
      a second resistor coupled between the third output end and the voltage source; and
      a current source coupled between the first node and a ground,
   wherein the amplifier further comprises:
      a first inductor coupled to the input end;
      a second capacitor coupled between the first inductor and a second node;
      a second inductor coupled between the voltage source and the first output end;
      a third transistor having a gate coupled to the second node, a first terminal coupled to the first output end, and a second terminal; and
      a third inductor coupled between the second terminal of the third transistor and the ground.

2. The single-ended input to differential-ended output amplifier circuit as claimed in claim 1, further comprising an antenna for receiving the input signal.

3. The single-ended input to differential-ended output amplifier circuit as claimed in claim 2, wherein the antenna is a single-ended antenna.

4. The single-ended input to differential-ended output amplifier circuit as claimed in claim 1, wherein the input signal is a radio frequency signal.

5. The single-ended input to differential-ended output amplifier circuit as claimed in claim 1, further comprising a third capacitor coupled between the first output end and the single-ended input to differential-ended output conversion circuit.

6. The single-ended input to differential-ended output amplifier circuit as claimed in claim 1, wherein the amplifier is a single-ended input to single-ended output amplifier.

7. The single-ended input to differential-ended output amplifier circuit as claimed in claim 6, wherein the amplifier is a low noise amplifier.

8. The single-ended input to differential-ended output amplifier circuit as claimed in claim 7, wherein the amplifier is a cascade amplifier.

9. The single-ended input to differential-ended output amplifier circuit as claimed in claim 1, wherein the amplifier further comprises a fourth transistor coupled between the first output end and the first terminal of the third transistor, and a gate coupled to the voltage source.

10. The single-ended input to differential-ended output amplifier circuit as claimed in claim 1, wherein the amplifier further comprises a bias source to provide a bias to the second node.

11. The single-ended input to differential-ended output amplifier circuit as claimed in claim 10, wherein the amplifier further comprises a third resistor coupled between the bias source and the second node.

12. The single-ended input to differential-ended output amplifier circuit as claimed in claim 1, wherein the output signal at the second output end and the third output end is a low noise figure and high gain signal.

13. The single-ended input to differential-ended output amplifier circuit as claimed in claim 1, wherein the second output end and the third output end is coupled to a first signal input terminal of an image-rejection mixer and a second signal input terminal of the image-rejection mixer, respectively.

14. The single-ended input to differential-ended output amplifier circuit as claimed in claim 13, further comprising:
 a fourth capacitor coupled between the second output end and the first signal input terminal; and
 a fifth capacitor coupled between the third output end and the second signal input terminal.

15. A signal processing circuit, comprising:
 an amplifier for amplifying an input signal into an amplified signal, comprising:
  an input end for receiving the input signal; and
  a first output end;
 a single-ended input to differential-ended output conversion circuit for amplifying the amplified signal into a differential signal pair, comprising:
  a first transistor for receiving the amplified signal having a gate coupled to the first input end, a first terminal coupled to a second output end, and a second terminal coupled to a first node;
  a second transistor having a gate, a first terminal coupled to a third output end, and a second terminal coupled to the first node;
  a first capacitor coupled between the second output end and the gate of the second transistor;
  a first resistor coupled between the second output end and a voltage source;
  a second resistor coupled between the third output end and the voltage source; and
  a current source coupled between the first node and a ground; and
 an image-rejection mixer, comprising:
  a first signal input terminal coupled to the second output end; and
  a second signal input terminal coupled to the third output end,
 wherein the amplifier further comprises:
  a first inductor coupled to the input end;
  a second capacitor coupled between the first inductor and a second node;
  a second inductor coupled between the voltage source and the first output end;
  a third transistor having a gate coupled to the second node, a first terminal coupled to the first output end, and a second terminal; and
  a third inductor coupled between the second terminal of the third transistor and the ground.

16. The signal processing circuit as claimed in claim 15, further comprising an antenna for receiving the input signal.

17. The signal processing circuit as claimed in claim 16, wherein the antenna is a single-ended antenna.

18. The signal processing circuit as claimed in claim 15, wherein the input signal is a radio frequency signal.

19. The signal processing circuit as claimed in claim 15, further comprising a third capacitor coupled between the first output end and the single-ended input to differential-ended output conversion circuit.

20. The signal processing circuit as claimed in claim 15, wherein the amplifier is a single-ended input to single-ended output amplifier.

21. The signal processing circuit as claimed in claim 20, wherein the amplifier is a low noise amplifier.

22. The signal processing circuit as claimed in claim 21, wherein the amplifier is a cascade amplifier.

23. The signal processing circuit as claimed in claim 15, wherein the amplifier further comprises a fourth transistor coupled between the first output end and the first terminal of the third transistor, and a gate coupled to the voltage source.

24. The signal processing circuit as claimed in claim 15, wherein the amplifier further comprises a bias source to provide a bias to the second node.

25. The signal processing circuit as claimed in claim 24, wherein the amplifier further comprises a third resistor coupled between the bias source and the second node.

26. The signal processing circuit as claimed in claim 15, wherein the output signal at the second output end and the third output end is a low noise figure and high gain signal.

27. The signal processing circuit as claimed in claim 15, further comprising:
 a fourth capacitor coupled between the second output end and the first signal input terminal; and
 a fifth capacitor coupled between the third output end and the second signal input terminal.

\* \* \* \* \*